United States Patent
Watatani

(10) Patent No.: US 6,605,510 B2
(45) Date of Patent: Aug. 12, 2003

(54) SEMICONDUCTOR DEVICE WITH BOTH MEMORIES AND LOGIC CIRCUITS AND ITS MANUFACTURE

(75) Inventor: Hirofumi Watatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/162,580

(22) Filed: Jun. 6, 2002

(65) Prior Publication Data

US 2002/0185662 A1 Dec. 12, 2002

Related U.S. Application Data

(62) Division of application No. 09/704,666, filed on Nov. 3, 2000, now Pat. No. 6,483,150.

(30) Foreign Application Priority Data

Mar. 1, 2000 (JP) .......................................... 2000-56201
Sep. 13, 2000 (JP) ....................................... 2000-278587

(51) Int. Cl.[7] ................ H01L 21/8234; H01L 21/8236; H01L 29/76; H01L 29/94; H01L 31/062
(52) U.S. Cl. ....................... 438/275; 438/276; 257/365
(58) Field of Search .......................... 257/368; 438/304, 438/311, 379, 275, 276

(56) References Cited

U.S. PATENT DOCUMENTS

| | | | | |
|---|---|---|---|---|
| 5,534,723 A | * | 7/1996 | Iwai et al. .................. | 257/360 |
| 5,610,089 A | * | 3/1997 | Iwai et al. .................. | 438/210 |
| 5,698,869 A | * | 12/1997 | Yoshimi et al. ............. | 257/192 |
| 2001/0029113 A1 | * | 10/2001 | Kunitomo et al. .......... | 438/785 |
| 2002/0000554 A1 | * | 1/2002 | Yamazaki et al. ............ | 257/59 |

FOREIGN PATENT DOCUMENTS

JP           11-097529           4/1999

* cited by examiner

*Primary Examiner*—Wael Fahmy
*Assistant Examiner*—William Vesperman
(74) *Attorney, Agent, or Firm*—Armstrong, Westerman & Hattori, LLP

(57) ABSTRACT

A first MISFET is formed in a first active region on the surface of a semiconductor substrate. The drain region of the first MISFET has a lightly doped drain structure with a low concentration region and a high concentration region. The side wall spacer conformingly covers the side wall of the gate electrode and the surface of the low concentration region in the drain region. A second MISFET is formed in a second active region. The side wall spacer of the second MISFET covers the side wall of the gate electrode and extends to the surface of the source and drain regions. An interlayer insulating film covers the said first MISFET and second MISFET and is made of material having an etching resistance different from that of the side wall spacers of the first MISFET and second MISFET.

9 Claims, 5 Drawing Sheets

SEMICONDUCTOR DEVICE WITH BOTH MEMORIES AND LOGIC CIRCUITS AND ITS MANUFACTURE

Application is a Divisional of Ser. No. 09/704,666 filed on Nov. 3, 2000 now U.S. Pat. No. 6,483,150.

This application is based on Japanese Patent Applications 2000-56201, filed on Mar. 1, 2000, and 2000-278587, filed on Sept. 13, 2000, the entire contents of which are incorporated herein by reference.

BACKGROUND OF THE INVENTION a) Field of the Invention

The present invention relates to a semiconductor device and its manufacture method, and more particularly to a semiconductor device and its manufacture method suitable for high integration of MISFET's.

b) Description of the Related Art

A conventional manufacture method will be described which manufactures a semiconductor device with both logic circuits and dynamic random access memories (DRAM).

A gate lamination structure is first formed which is a lamination of a gate insulating film, a gate electrode and a silicon nitride film. By using the gate lamination structure as a mask, ions are implanted into active regions on both sides of the gate lamination structure to form low concentration regions of a lightly doped drain (LDD) structure. A side wall spacer of silicon oxide is then formed on the side wall of the gate lamination structure.

By using the side wall spacer as a mask, ions are implanted to form source/drain regions. Metal silicide films are formed on the surfaces of the source/drain regions of each transistor in the logic circuit area. A silicon nitride film is formed over the whole surface of the substrate, and an interlayer insulating film of silicon oxide is formed on the silicon nitride film. The silicon nitride film functions as an etching stopper when contact holes to the source/drain regions are formed.

Since the upper and side surfaces of the gate electrode are covered with the silicon nitride film, the gate electrode can be prevented from being exposed in contact holes formed through the interlayer insulating film of silicon oxide. The silicon nitride film exposed on the bottom of the contact hole is removed by phosphoric acid or the like. During this removal process, the side wall of the gate electrode is protected by the side wall spacer of silicon oxide. The silicon nitride film on the upper surface of the gate electrode is sufficiently thicker than the silicon nitride film exposed on the bottom of the contact hole. The upper surface of the gate electrode is not therefore exposed in the contact hole.

In this manner, the contact holes to the source/drain regions can be formed in a self-alignment manner.

As the space between gate electrodes becomes narrow linearly with an improved integration degree of DRAMs, an effective contact area of the source or drain region between gate electrodes becomes small being influenced by the thickness of side wall spacer and etching stopper silicon nitride film. A reduced contact area results in an increase in contact resistance. As the space between gate electrodes is made narrow by the side wall spacer and etching stopper silicon nitride film, it is difficult to fill the space between gate electrodes with an interlayer insulating film. As the space between gate electrodes is made still narrower, this space may be completely filled with the etching stopper silicon nitride film and the contact hole cannot be formed.

SUMMARY OF THE INVENTION

It is an object of the present invention to provide a semiconductor device and its manufacture method capable of filling an interlayer insulating film in a space between gate electrodes with good reproductivity even if the space is narrow.

It is another object of the present invention to provide a semiconductor device and its manufacture method capable of forming a contact hole in a region between gate electrodes with good reproductivity even if a space between gate electrodes is narrow.

According to one aspect of the present invention, there is provided a semiconductor device comprising: a semiconductor substrate; an element separation insulating film formed on a surface of the semiconductor substrate and defining first and second active regions: a first MISFET formed in the first active region and having a gate insulating film, a gate electrode, a source region, a drain region and a side wall spacer, the drain region of the first MISFET having a lightly doped drain structure with a low concentration region and a high concentration region, the low concentration region contacting the gate electrode as viewed along a substrate normal direction, and the side wall spacer conformingly covering a side wall of the gate electrode and a surface of the low concentration region in the drain region; a second MISFET formed in the second active region and having a gate insulating film, a gate electrode, a source region, a drain region and a side wall spacer, the side wall spacer of the second MISFET covering a side wall of the gate electrode and extending to surfaces of the source and drain regions; and an interlayer insulating film covering the first MISFET and second MISFET and being made of material having an etching resistance different from an etching resistance of the side wall spacers of the first MISFET and second MISFET.

The side wall spacer of the first MISFET is formed conformingly with a surface of underlying layer. Accordingly, as compared to the length of the low concentration region, the side wall spacer on the side wall of the gate electrode is thinner. As compared to the case where a side wall spacer having a thickness approximately equal to the length of the low concentration region is formed, a space between a gate electrode and an adjacent gate electrode or the like can be broadened. The side wall spacer of the second MISFET does not cover the upper the surfaces of the source and drain regions. Accordingly, a contact area between an upper wiring layer and the source/drain region via the contact hole can be broadened.

According to another aspect of the present invention, there is provided a method of manufacturing a semiconductor device, comprising steps of: (a) forming an element separation insulating film on a surface of a semiconductor substrate to define a first active region surrounded by the element separation insulating film; (b) forming a first gate lamination structure on a partial surface area of the first active region, the first gate lamination structure including a gate insulating film and a gate electrode; (c) implanting impurities of a first conductivity type into surface layers of the semiconductor substrate on both sides of the first gate lamination structure, by using the first gate lamination structure as a mask; (d) covering the first gate lamination structure with a first film made of insulating material; (e) forming a second film on the first film, the second film being made of insulating material having an etching resistance different from an etching resistance of the first film; (f) anisotropically etching the second and first films to leave a first side wall spacer on a side wall of the first gate lamination structure, the first side wall spacer including at least two layers of the first and second films; (g) implanting impurities of the first conductivity type in surface layers of the semiconductor substrate, by using the first gate lamination structure and the first side wall spacer as a mask; (h) selectively removing the second film of the two layers constituting the first side wall spacer; (i) forming metal silicide films on surfaces of regions where the impurities were implanted by said implanting step (g); and j) forming an interlayer insulating film covering the first gate lamination structure and the metal silicide films.

Since the second film is selectively removed after the second impurity implanting step, the side wall spacer left on the side wall of the first gate lamination structure is made thin. The size of the impurity doped region by the first impurity implanting step is determined by the total thickness of the first and second films. By adjusting the thickness of the second film, the size of the impurity doped region by the first impurity implantation step can be controlled.

According to another aspect of the present invention, there is provided a method of manufacturing a semiconductor device, comprising steps of: (a) forming an element separation insulating film made of silicon oxide on a surface of a semiconductor substrate to define a first active region surrounded by the element separation insulating film; (b) forming a first gate lamination structure on a partial surface area of the first active region, the first gate lamination structure including a gate insulating film and a gate electrode; (c) implanting impurities of a first conductivity type into surface layers of the semiconductor substrate on both sides of the first gate lamination structure, by using the first gate lamination structure as a mask; (d) covering the first gate lamination structure with a first film made of insulating material having an etching resistance different from an etching resistance of silicon oxide; (e) forming a second film made of silicon oxide on the first film; (f) anisotropically etching the second and first films to leave a first side wall spacer on a side wall of the first gate lamination structure, the first side wall spacer including at least two layers of the first and second films; (g) implanting impurities of the first conductivity type in surface layers of the semiconductor substrate, by using the first gate lamination structure and the first side wall spacer as a mask; (h) selectively removing the second film of the two layers constituting the first side wall spacer; (i) forming a metal silicide film on surfaces of regions where the impurities were implanted by said second impurity implanting step; and (j) forming an interlayer insulating film covering the first gate lamination structure and metal silicide films.

The etching speed of silicon oxide containing at least phosphorous or boron is faster than that of undoped silicon oxide. It is possible to reduce the etching amount of the surface of the element separation film while the second film is selectively removed.

As described above, the side wall spacer of the gate electrode of MISFET having the LDD structure is thin as compared with the length of the low concentration region. Gate electrodes can be disposed nearer to each other. The side wall spacer of MISFET without the LDD structure can be made thin without any restriction by the length of the low concentration region of MISFET with the LDD structure. An integration degree can therefore be improved.

DETAILED DESCRIPTION OF THE PREFERRED EMBODIMENT

A method of manufacturing a semiconductor device according to an embodiment of the invention will be described by taking as an example a semiconductor device having mixed logic circuits and DRAMs. In each drawing of FIGS. 1A to 1L, the left area shows a cross sectional view of a DRAM area and the right area shows a cross sectional view of a logic circuit area.

Figure 1A:
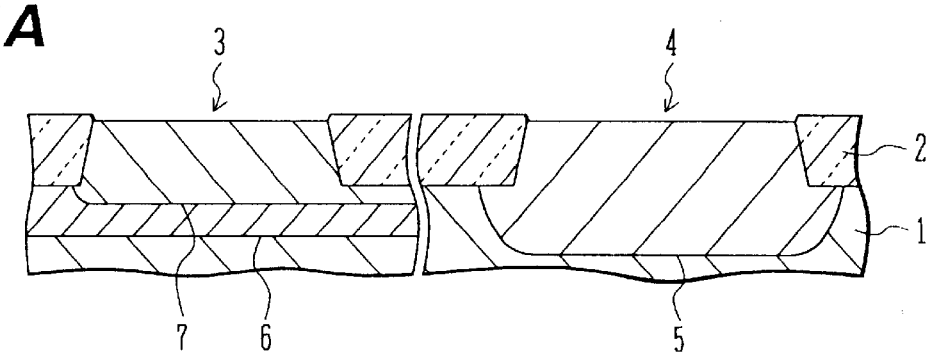
FIGS. 1A to 1L are cross sectional views illustrating processes of a semiconductor device manufacture method according to an embodiment of the invention.

As shown in FIG. 1A, an element separation insulating film 2 of a shallow trench type is formed on the surface of a p-type silicon substrate 1. A method of forming the element separation insulating film 2 will be briefly described.

First, the surface of the silicon substrate 1 is thermally oxidized to form a silicon oxide film having a thickness of about 5 nm. On this silicon oxide film, a 100 nm thick silicon nitride film is formed by low pressure chemical vapor deposition (LP-CVD). The silicon nitride film is removed which was formed in an area where the element separation insulating film 2 is to be formed. By using the remaining silicon nitride film as a mask, the surface layer of the silicon substrate 1 is etched to form a trench having a depth of about 400 nm. The side wall of the trench is thermally oxidized to form a silicon oxide film having a thickness of 10 nm.

A 700 nm thick silicon oxide film is deposited on the substrate whole surface. This silicon oxide film is deposited by high density plasma CVD (HDP-CVD) using high density plasma of mixed gas of silane ($SiH_4$) at a flow rate of 150 sccm, oxygen ($O_2$) at a flow rate of 300 sccm, and helium (He) at a flow rate of 325 sccm. The silicon oxide film fills the inside of the trench.

The silicon oxide film is subjected to chemical mechanical polishing (CMP) to remove the silicon oxide film deposited in an area other than the trench. At this time, the silicon nitride film under the silicon oxide film functions as a stopper. Then, the exposed silicon nitride film is removed to expose the surface of the silicon substrate 1. The element separation films 2 define an active region 3 in the DRAM area and an active region 4 in the logic circuit area.

An n-type well 6 is formed in the surface layer of the silicon substrate 1 in the DRAM area, and a p-type well 7 is formed in the region corresponding to the active region 3. The p-type well 7 is located inside the n-type well 6. An n-type well 5 is formed in the region corresponding to the active region 4. Although not shown in FIG. 1A, in a region corresponding to a region where an n-channel MISFET (metal/insulator/semiconductor type field effect transistor) is to be formed, a p-type well is formed. By forming the n-type well 6 in the DRAM area, the operating potentials of a DRAM circuit can be set independently from that of a logic circuit.

Figure 1B:
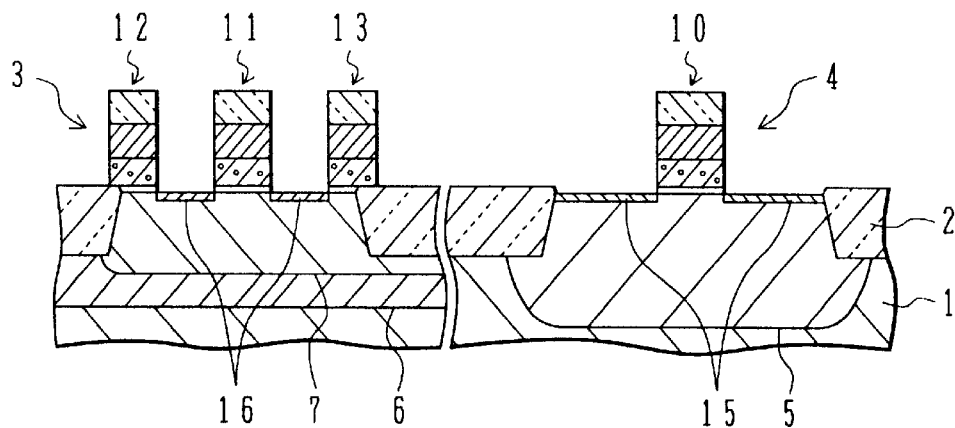

The processes of forming the structure shown in FIG. 1B will be described. The surfaces of the active regions 3 and 4 are thermally oxidized to form a silicon oxide film having a thickness of 2.5 nm. A 100 nm thick polysilicon film, a 100 nm thick tungsten silicide film and a 100 nm thick silicon nitride film are sequentially deposited in this order over the whole surface of the silicon substrate 1. These three films are patterned to leave lamination structures 10 to 13. The lamination structure 10 is disposed in a partial area of the active region 4, and the lamination structure 11 is disposed in a partial area of the active region 3. The lamination structures 12 and 13 are disposed on both sides of the lamination structure 11, with a space therebetween of, for example, 0.22 to 0.24 μm.

The polysilicon film and tungsten silicide film in the lamination structure 10 constitute the gate electrode of MISFET in the logic circuit area. The polysilicon film and tungsten silicide film in the lamination structure 11 constitute the gate electrode of MISFET of a DRAM cell.

By using the lamination structures 10 to 13 as a mask, arsenic (As) ions are implanted. In the logic circuit area, low concentration regions 15 of the LDD structure are formed on both sides of the lamination structure 10. In the DRAM area, source/drain regions 16 are formed on both sides of the lamination structure 11. In the logic circuit area where an n-channel MISFET is to be formed, boron (B) ions are implanted. The low concentration region 15 is in contact with the lamination structure 10 as viewed along a direction normal to the substrate.

Figure 1C:
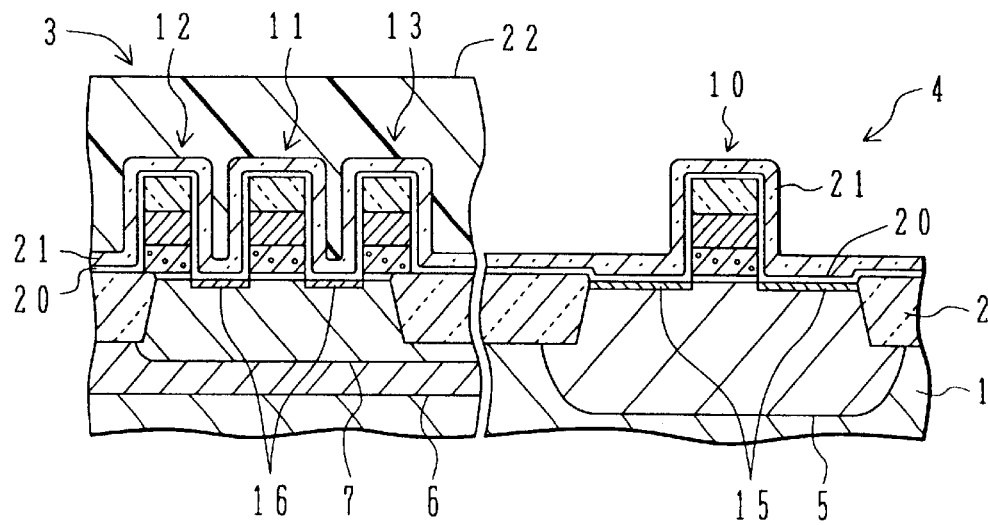

The processes of forming the structure shown in FIG. 1C will be described. A 20 nm thick silicon nitride film 20 is formed over the whole surface of the silicon substrate 1. On this silicon nitride film 20, a 40 nm thick phosphosilicate glass (PSG) film 21 is formed. This PSG film 21 is formed by low pressure CVD using helium as a carrier gas, tetra-ethylorthosilicate (TEOS), ozone ($O_3$) and trimethylphosphate ($PO(OCH_3)_3$) as the source gas. This CVD is executed under the growth conditions of TEOS at a flow rate of 1000 mg/min, ozone at a flow rate of 5000 sccm, TEOP at a flow rate of 70 g/min, helium at a flow rate of 6000 sccm, a pressure of 60 kPa (450 Torr), and a growth temperature of 480° C. Under these growth conditions, the phosphorous concentration in the PSG film 21 is about 3 wt. %. A resist pattern 22 is formed covering the surface of the PSG film 21 in the DRAM area.

The processes of forming the structure shown in FIG. 1D will be described. By using as a mask the resist pattern 22 shown in FIG. 1C, the PSG film 21 and silicon nitride film 20 in the logic circuit area are anisotropically etched. Side spacer 25 is therefore left on the side wall of the lamination structure 20, the side spacer 25 having a two-layer structure of a silicon nitride film 20a and a PSG film 21a. After the anisotropic etching, the resist pattern 22 is removed.

By using the lamination structure 10 and side wall spacer 25 as a mask, arsenic ions are implanted into the surface layer of the active region 4. High concentration regions 26 of the source/drain regions are therefore formed. In the logic circuit area where an n-channel MISFET is to be formed, boron ions are implanted. In order to activate implanted impurity ions, a heat treatment is performed at 1000° C.

Figure 1D:
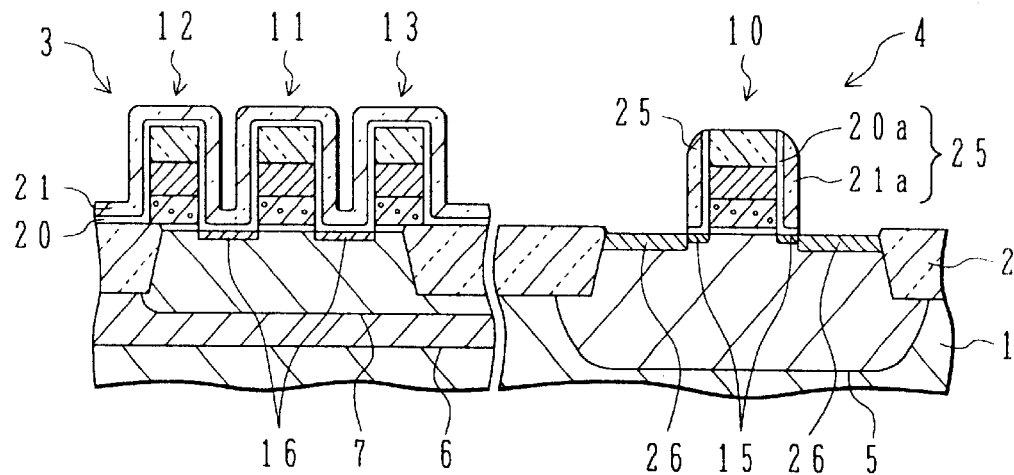
Figure 1E:
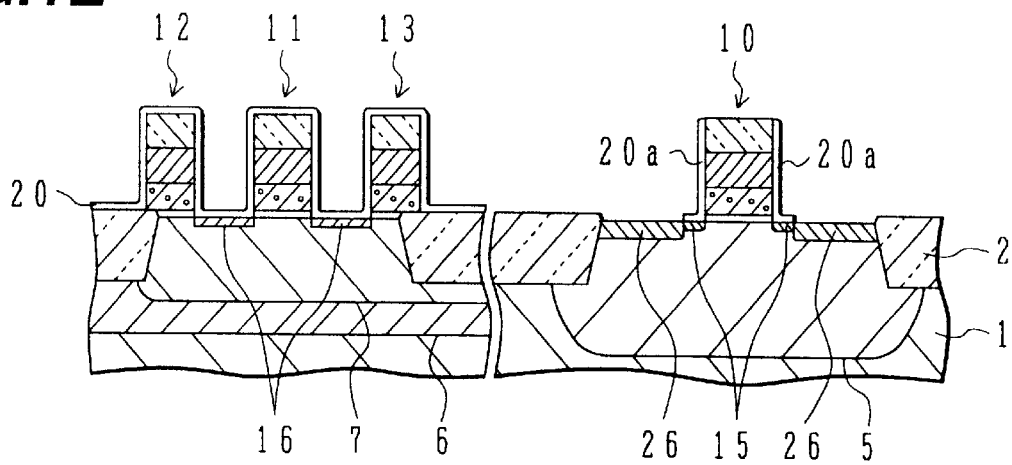

As shown in FIG. 1E, the PSG film 21a constituting the side wall spacer 25 and the PSG film 21 left in the DRAM area are removed by hydrofluoric acid (HF). For example, etchant to be used is hydrofluoric acid solution of 0.25 vol. % containing hydrofluoric acid of 50% density diluted with water. Removing the PSG film 21 is executed under the condition that the silicon oxide film formed through thermal oxidization is etched by 12 nm in thickness. Under this condition, the PSG film having a phosphorous density of 3 wt. % is etched by about 55 nm. The 40 nm thick PSG film 21 can therefore be removed completely.

In place of the 40 nm thick PSG film 21, an undoped silicon oxide film of 40 nm in thickness may be used which is formed by CVD using ozone ($O_3$) and tetraethylorthosilicate (TEOS) as the source gas. This silicon oxide film is called an $O_3$-TEOS film. The etching amount of the $O_3$-TEOS film is 40 nm or less when it is etched under the condition that the silicon oxide film formed through thermal oxidization is etched by 12 nm in thickness.

It is preferable to perform over-etching of 20% when variations of film thicknesses and etching amounts are taken into consideration. Namely, in order to completely remove the 40 nm thick $O_3$-TEOS film, it is preferable to etch it under the condition that the silicon oxide film formed through thermal oxidization is etched by 14.4 nm in thickness.

While the PSG films 21 and 21a are etched, the surface of the element separation insulating film 2 is exposed to the etchant. However, because the element separation insulating film 2 is an undoped silicon oxide film formed through PE-CVD using $SiH_4$ and $O_2$ as the source gas, the etching speed is slower than that of the PSG film. It is therefore possible to reduce the etching amount of the surface of the element separation insulating film 2 while the PSG films 21 and 21a are etched.

The etching speed of the $O_3$-TEOS film is also faster than that of the element separation insulating film 2. As a result, the etching amount of the surface of the element separation insulating film 2 can be reduced also when the $O_3$-TEOS film is used in place of the PSG film 21.

Of the two films constituting the side wall spacer 25, the silicon nitride film 20a is left unetched. The silicon nitride film 20a covers the side wall of the lamination structure 20 and the upper surface of the low concentration regions 15, conformingly with the underlying layers.

Since the nitride film is formed as the highest layer of the lamination structure 10, the upper surface of the lamination structure 10 is not etched while the PSG films 21 and 21a are etched. The highest layer of the lamination structure 10 may be made of undoped silicon oxide having an etching speed slower than PSG.

Figure 1F:
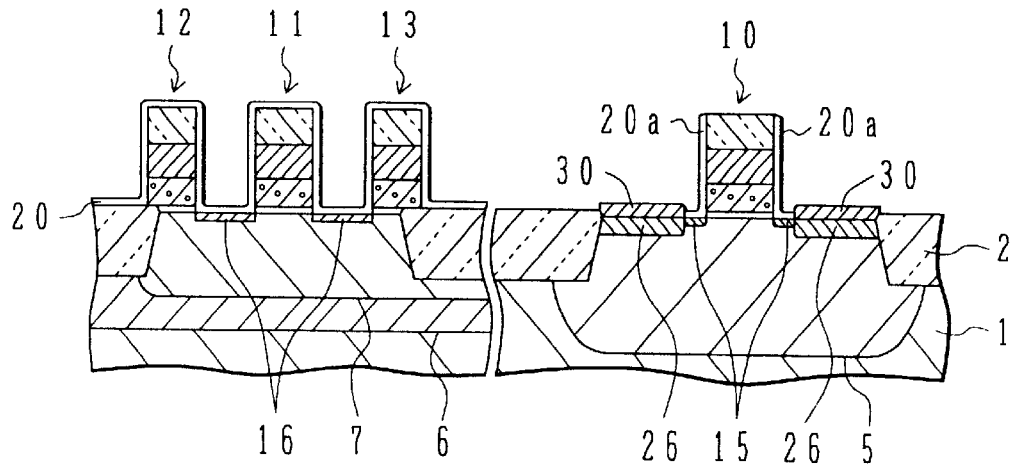

As shown in FIG. 1F, a cobalt silicide (CoSi) film 30 is formed on the surfaces of the high concentration regions 26 of the source/drain regions. The CoSi film 30 is formed by depositing a 10 nm thick cobalt film over the substrate whole surface and thereafter by executing a heat treatment. This heat treatment is executed for about 30 minutes in a nitrogen atmosphere at 500° C.

Figure 1G:
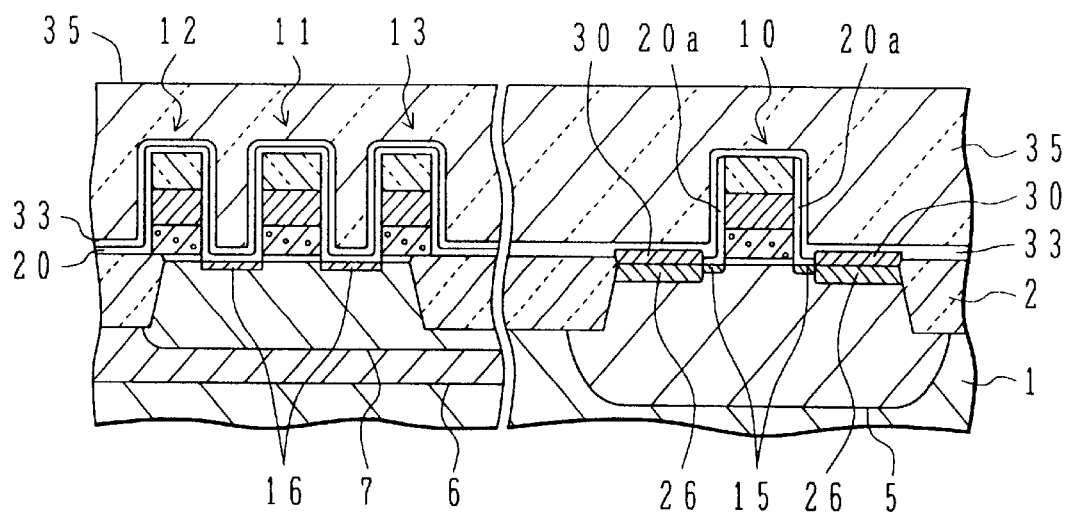

As shown in FIG. 1G, a 25 nm thick silicon nitride film 33 is formed covering the substrate whole surface. This silicon nitride film 33 is formed by CVD using silane, ammonium and nitrogen. The growth temperature is set to 700° C.

A borophosphosilicate glass (BPSG) film 35 having a thickness of 1100 nm is formed on the silicon nitride film 33, and a reflow process is executed at 700° C. The BPSG film 35 is formed by using helium at a flow rate of 6000 sccm as a carrier gas, TEOS at a flow rate of 600 mg/min, trimethylphosphate at a flow rate of 130 mg/min, trimethylborate ($B(OCH_3)_3$) at a flow rate of 160 mg/min, ozone at a flow rate of 4000 sccm as the source gas, under the conditions of a growth pressure of 27 kPa (200 Torr) and a growth temperature of 480° C.

The PSG film 21 shown in FIG. 1D was removed before the BPSG film 35 is formed. The thickness of the PSG film 21 is 40 nm, whereas that of the silicon nitride film 33 shown in FIG. 1G is 25 nm. As compared to the case wherein the PSG film 21 is left, the spaces between the lamination structures 11 to 13 in the DRAM area can be made broader. It is therefore easy to fill the spaces with the BPSG film 35.

In the logic circuit area, as compared to the length of the low concentration region 15, the side wall spacer 20a covering the side wall of the lamination structure 10 is thin. The length of the low concentration region 15 is determined from the electric characteristics required for MISFET, and a predetermined length is required. The side wall spacer 25 shown in FIG. 1D is therefore required to have a corresponding thickness. If the PSG film 21a constituting the side wall spacer 25 is left unetched, the lamination structure 10 and another nearby lamination structure are required to be spaced additionally by a thickness of the PSG film 21a, in order to facilitate to fill the BPSG film 35 in the space between the lamination structures. In this embodiment, since the PSG film 21a was removed, a space between the lamination structure and another adjacent lamination structure can be narrowed.

Figure 1H:
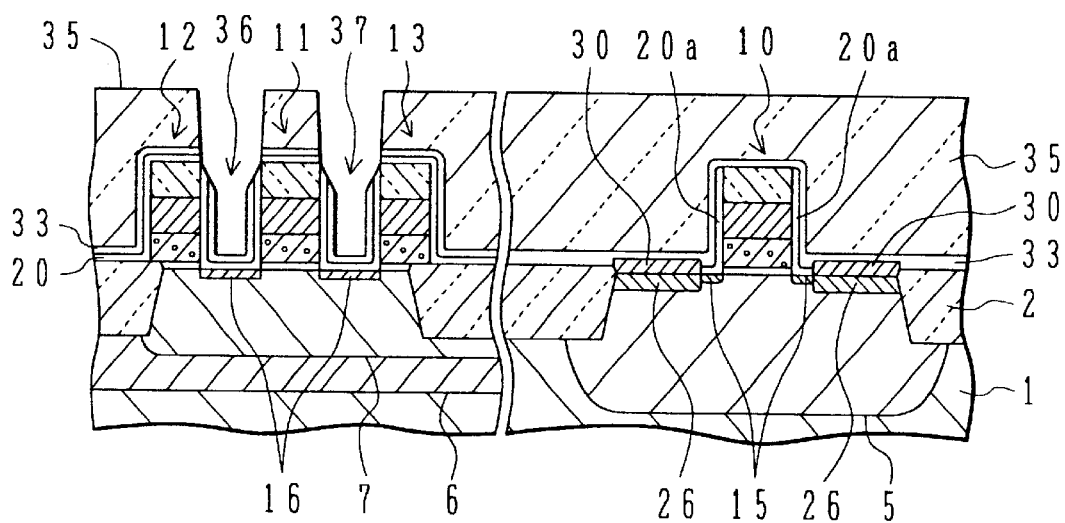

As shown in FIG. 1H, contact holes 36 and 37 are formed through the BPSG film 35 in the areas corresponding to the source/drain regions 16. At this time, the silicon nitride films 20 and 33 function as the etching stopper. Although the silicon nitride films 20 and 33 at the shoulders of the lamination structures 11 to 13 are etched in some cases, the gate electrodes are not exposed in the contact holes because the 100 nm thick silicon nitride film is disposed as the highest layer of each lamination structure. In this manner, the contact holes 36 and 37 can be formed in a self-alignment manner.

Figure 1I:
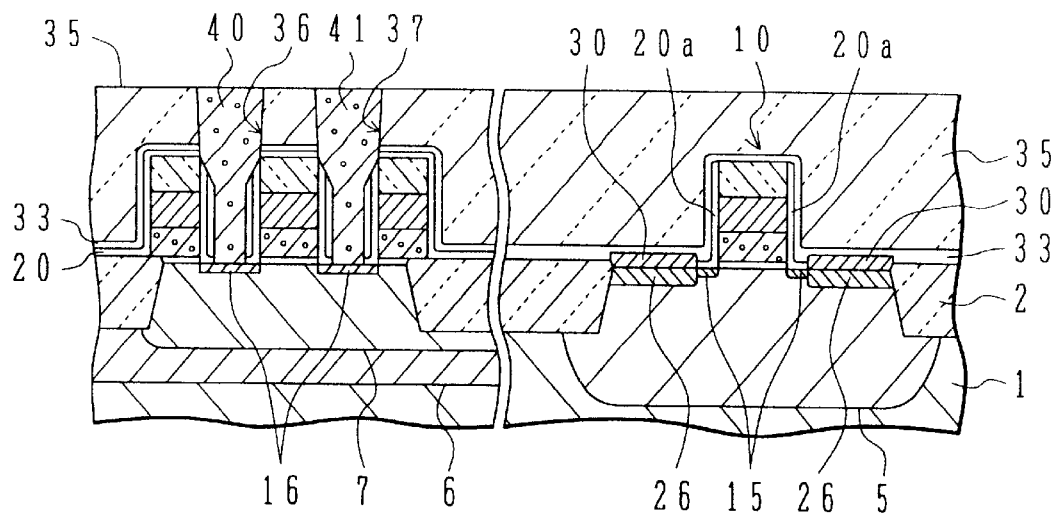

As shown in FIG. 1I, the silicon nitride films 20 and 33 exposed on the bottoms of the contact holes 36 and 37 are anisotropically etched and removed. The silicon nitride films 20 and 33 on the side walls of the contact holes 36 and 37 are left unetched. The contact holes 36 and 37 are filled with polysilicon plugs 40 and 41 doped with impurities and imparted with conductivity. The polysilicon plugs 40 and 41 are formed by depositing a polysilicon film over the substrate whole surface and then planarizing the polysilicon film on the flat surface by CMP.

At this stage, the PSG film 21 formed on the side wall of the lamination structures 11 to 13 shown in FIG. 1D was already removed. In place of the PSG film 21, the silicon nitride film 33 thinner than the PSG film 21 was formed. As a result, the contact areas between the plugs 36 and 37 and the source/drain regions 16 can be broadened.

In the logic circuit area, the side wall spacer 20a covers the side wall of the lamination structure 10 and extends to cover the upper surface of the low concentration region of the source/drain regions. In contrast, in the DRAM area, although the side wall spacer constituted of two layers, silicon nitride films 20 and 33, covers the side wall of the lamination structures 11 to 13, it does not cover the upper surfaces of the source/drain regions.

Figure 1J:
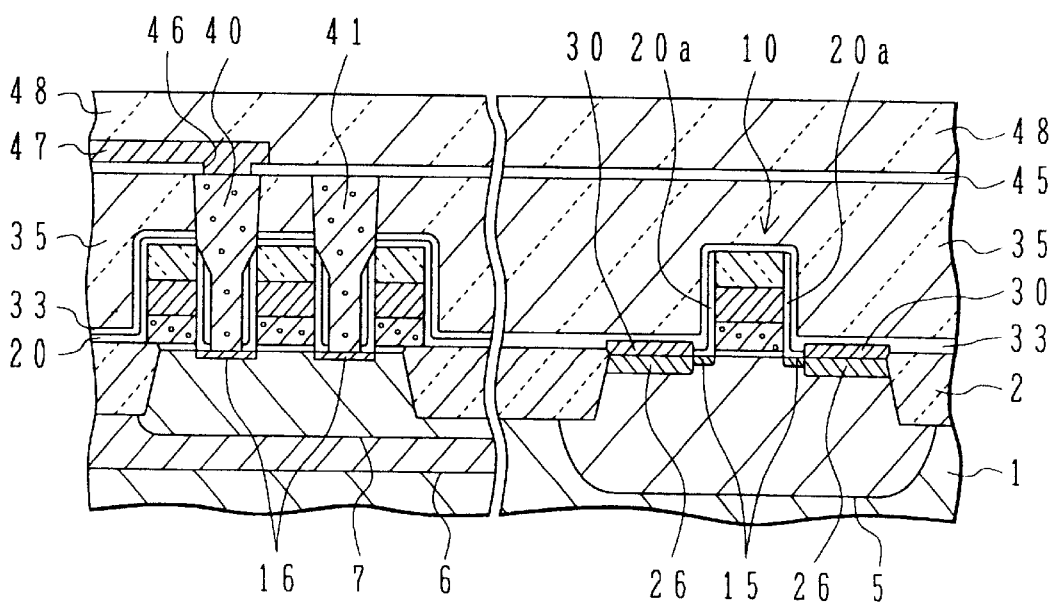

As shown in FIG. 1J, a 100 nm thick silicon oxide film 45 is formed on the BPSG film 35. This silicon oxide film 45 is formed by using a diode parallel plate plasma CVD system. An opening 46 is formed through the silicon oxide film 45 in an area corresponding to the polysilicon plug 40.

A bit line 47 is formed on the silicon oxide film 45. The bit line 47 has a three-layer structure of a Ti layer, a TiN layer and a W layer sequentially stacked in this order. The bit line 47 fills the opening 46 and is electrically connected to the polysilicon plug 40. Another silicon oxide film 48 having a thickness of 500 nm is formed on the silicon oxide film 45, covering the bit line 47. The silicon oxide film 48 is formed by plasma CVD using high density plasma such as inductive coupled plasma.

Figure 1K:
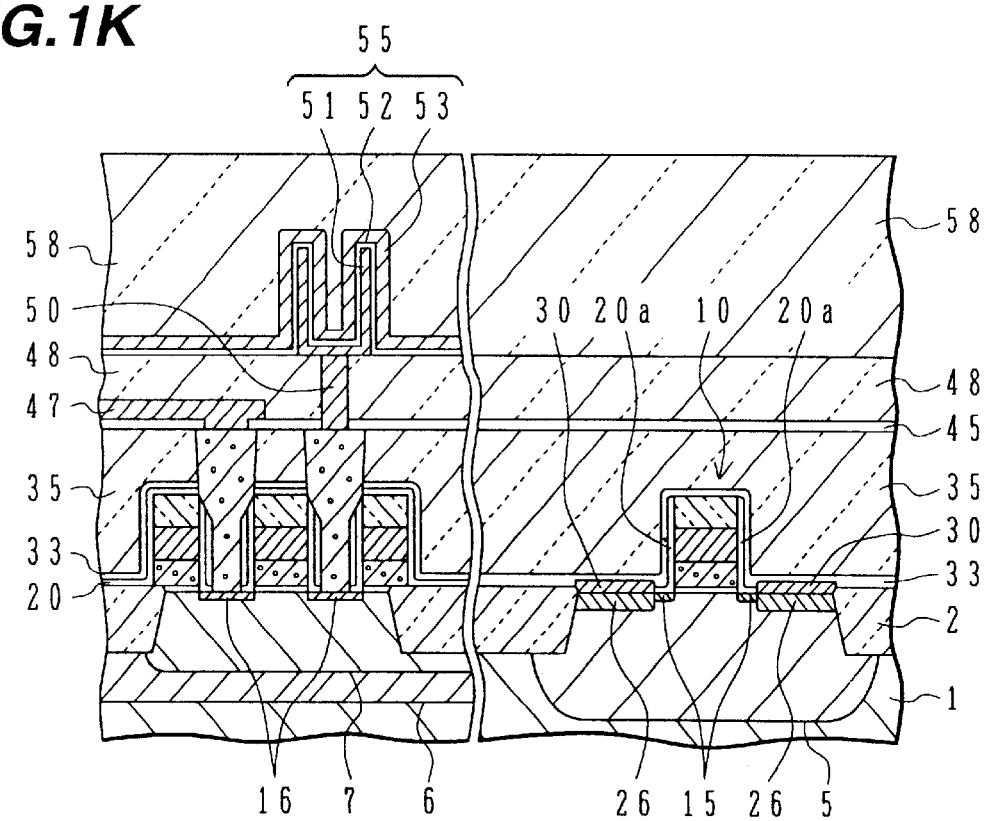

As shown in FIG. 1K, a contact hole is formed through the silicon oxide films 48 and 45 in an area corresponding to the polysilicon plug 41. This contact hole is filled with a plug 50 made of amorphous silicon doped with impurities and imparted with conductivity.

A capacitor 55 is formed on the silicon oxide film 48 in an area corresponding to the plug 50. The capacitor 55 is constituted of a storage electrode 51, a dielectric film 52 and a cell plate 53. The storage electrode 51 is made of amorphous silicon imparted with conductivity and has a tubular shape with a closed bottom and an opened top. The storage electrode 51 is electrically connected at its bottom to the plug 50.

The dielectric film 52 is made of a silicon oxynitride film. The silicon oxynitride film is formed by thermally oxidizing a silicon nitride film. The cell plate 53 is made of amorphous silicon imparted with conductivity. Such a capacitor can be formed by the method illustrated in FIG. 7 of JP-A-11-195618.

Another silicon oxide film 58 having a thickness of 1.5 μm is formed on the silicon oxide film 48, covering the capacitor 55. The silicon oxide film 58 is formed by plasma CVD using high density plasma.

Figure 1L:
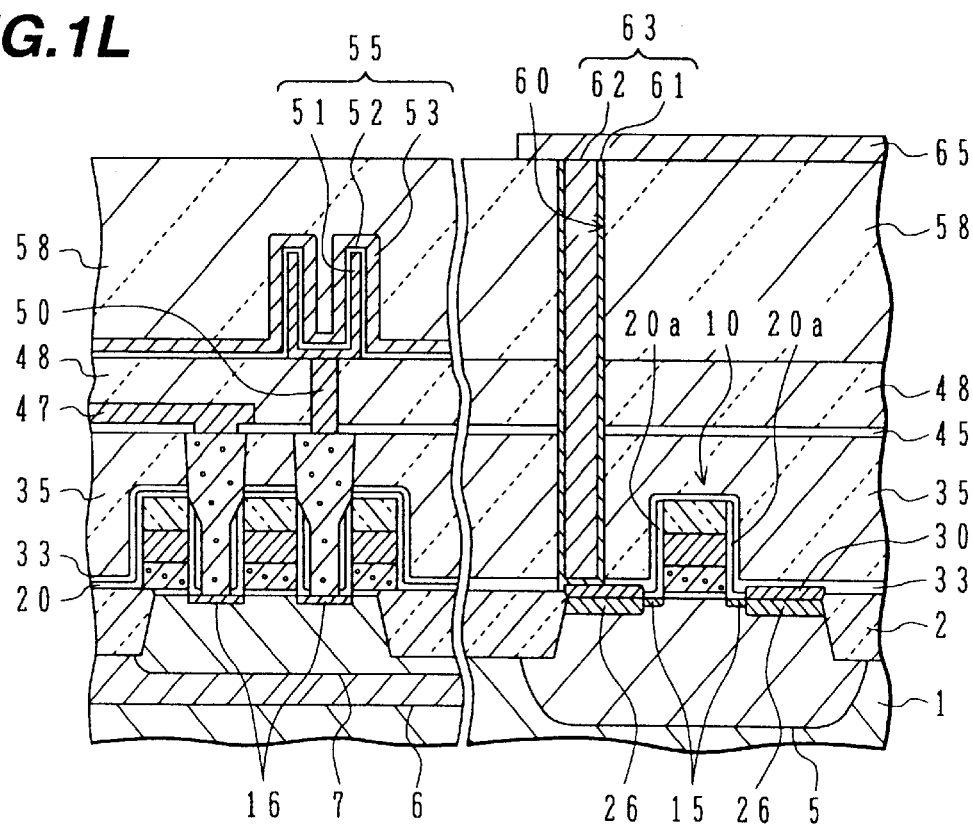

As shown in FIG. 1L, a contact hole 60 is formed starting from the upper surface of the silicon oxide film 58 and reaching the upper surface of the cobalt silicide film 30. The bottom of the contact hole 60 is located to ride over the boundary between the cobalt silicide film 30 and element separation insulating film 2. While the contact hole 60 is formed, the silicon nitride film 33 covering the upper surface of the cobalt silicide film 30 functions as the etching stopper. The silicon nitride film 33 exposed on the bottom of the contact hole 60 is etched by hydrofluoric acid or the like.

A barrier metal layer 61 is formed on the inner surface of the contact hole 60 and on the upper surface of the silicon oxide film 58, the barrier metal layer 61 having a two-layer structure of a Ti layer and a TiN layer. A W layer 62 is formed on the barrier metal layer 61, filling the contact hole 60. The W layer 62 and barrier metal layer 61 are subjected to CMP to leave a conductive plug 63 in the contact hole 60. A conduction wire 65 is formed on the silicon oxide film 58, and a multi-layer wiring structure is formed over the substrate whole surface, covering the conduction wire 65.

In this embodiment, as described with FIG. 1E, the etching amount of the surface of the element isolation insulating film 2 can be reduced while the PSG films 21 and 21a shown in FIG. 1D are etched. If the upper surface of the element isolation insulating film 2 is etched, a large step is formed between the cobalt silicide film 30 and element isolation insulating film 2 shown in FIG. 1L. A large step is known to degrade the channel stopper function of the silicon nitride film 33. The contact hole 60 may therefore reach the n-type well 5 to make the conductive plug 63 directly contact the n-type well 5. Since the etching amount of the upper surface of the element isolation insulating film 2 is reduced in the process shown in FIG. 1E, it is possible to prevent direct contact between the conductive plug 63 and n-type well 5.

In this embodiment, the outer layer of the side wall spacer 25 shown in FIG. 1D is made of the PSG film 21a having a phosphorous density of 3 wt. %. Other materials having a faster etching speed than an undoped silicon oxide film may be used for the outer layer. For example, it may be made of borosilicate glass (BSG) or BPSG. If PSG is used, it is preferable to set the phosphorous density to 3 wt. % or higher in order to have a sufficiently large etching speed difference between the PSG film and undoped silicon oxide film. However, if the PSG film is sufficiently thin and the etching time is short, the phosphorous density may be set to 3 wt. % or smaller.

In this embodiment, as described with FIG. 1D, the length of the low concentration region 15 of MISFET having the LDD structure is defined by the total thickness of the silicon nitride film 20a and PSG film 21a. By adjusting the thickness of the PSG film 21a, the low concentration region 15 can be set to a desired length. In the DRAM area, as described with FIG. 1G, the PSG film 21 is not left in the spaces between the lamination structures 11 to 13. The integration degree of DRAMs can therefore be improved without being restricted by the length of the low concentration region of MISFET in the logic circuit area.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device, comprising steps of:
    (a) forming an element separation insulating film on a surface of a semiconductor substrate to define a first active region surrounded by the element separation insulating film;
    (b) forming a first gate lamination structure on a partial surface area of the first active region, the first gate lamination structure including a gate insulating film and a gate electrode;
    (c) implanting impurities of a first conductivity type into surface layers of the semiconductor substrate on both sides of the first gate lamination structure, by using the first gate lamination structure as a mask;
    (d) covering the first gate lamination structure with a first film made of insulating material;
    (e) forming a second film on the first film, the second film being made of insulating material having an etching resistance different from an etching resistance of the first film;
    (f) anisotropically etching the second and first films to leave a first side wall spacer on a side wall of the first gate lamination structure, the first side wall spacer including at least two layers of the first and second films;
    (g) implanting impurities of the first conductivity type in surface layers of the semiconductor substrate, by using the first gate lamination structure and the first side wall spacer as a mask;
    (h) selectively removing the second film of the two layers constituting the first side wall spacer;
    (i) forming metal silicide films on surfaces of regions where the impurities were implanted by said implanting step (g); and
    (j) forming an interlayer insulating film covering the first gate lamination structure and the metal silicide films.

2. A method of manufacturing a semiconductor device according to claim 1, wherein:
    said step (a) includes a step of defining a second active region in an area different from the first active region;
    said step (b) includes a step of forming a second gate lamination structure having a same structure as the first gate lamination structure, on a partial surface area of the second active region;
    said step (c) includes a step of implanting impurities in surface layers of the semiconductor substrate on both sides of the second gate lamination structure, by using the second gate lamination structure as a mask;
    said step (d) includes a step of covering the second gate lamination structure with the first film;
    said step (f) includes a step of covering the second film in the second active region with a mask pattern and a step of anisotropically etching the first and second films in an area not covered with the mask pattern;
    the method further comprises a step of removing the mask pattern before said step (h);
    the second film in the second active region is also removed by said step (h); and
    in said step (j), the second gate lamination structure is also covered with the interlayer insulating film.

3. A method of manufacturing a semiconductor device according to claim 2 wherein said first active region is located in a logic circuit area and said second active region is located in a memory cell area.

4. A method of manufacturing a semiconductor device according to claim 1, wherein the element separation insulating film is made of silicon oxide and the second film is made of a material selected from a group consisting of phosphosilicate glass, borosilicate glass and borophosphosilicate glass.

5. A method of manufacturing a semiconductor device according to claim 1, wherein the element separation insulating film is formed by CVD using $O_2$ and $SiH_4$, and the second film is formed by CVD using $O_3$ and TEOS.

6. A method of manufacturing a semiconductor device, comprising steps of:
    (a) forming an element separation insulating film made of silicon oxide on a surface of a semiconductor substrate to define a first active region surrounded by the element separation insulating film;
    (b) forming a first gate lamination structure on a partial surface area of the first active region, the first gate lamination structure including a gate insulating film and a gate electrode;
    (c) implanting impurities of a first conductivity type into surface layers of the semiconductor substrate on both sides of the first gate lamination structure, by using the first gate lamination structure as a mask;
    (d) covering the first gate lamination structure with a first film made of insulating material having an etching resistance different from an etching resistance of silicon oxide;
    (e) forming a second film made of silicon oxide on the first film;
    (f) anisotropically etching the second and first films to leave a first side wall spacer on a side wall of the first gate lamination structure, the first side wall spacer including at least two layers of the first and second films;
    (g) implanting impurities of the first conductivity type in surface layers of the semiconductor substrate, by using the first gate lamination structure and the first side wall spacer as a mask;
    (h) selectively removing the second film of the two layers constituting the first side wall spacer;
    (i) forming a metal silicide film on surfaces of regions where the impurities were implanted by said second impurity implanting step; and
    (j) forming an interlayer insulating film covering the first gate lamination structure and metal silicide films.

7. A method of manufacturing a semiconductor device according to claim 6, wherein
    said step (a) includes a step of defining a second active region in an area different from the first active region;
    said step (b) includes a step of forming a second gate lamination structure having a same structure as the first gate lamination structure, on a partial surface area of the second active region;

said step (c) includes a step of implanting impurities in surface layers of the semiconductor substrate on both sides of the second gate lamination structure, by using the second gate lamination structure as a mask;

said step (d) includes a step of covering the second gate lamination structure with the first film;

said step (f) includes a step of covering the second film in the second active region with a mask pattern and a step of anisotropically etching the first and second films in an area not covered with the mask pattern;

the method further comprises a step of removing the mask pattern before said step (h);

the second film in the second active region is also removed by said step (h); and in said step (j), the second gate lamination structure is also covered with the interlayer insulating film.

8. A method of manufacturing a semiconductor device according to claim 7, wherein said first active region is located in a logic circuit area and said second active region is located in a memory cell area.

9. A method of manufacturing a semiconductor device according to claim 6, wherein the second film is made of silicon oxide containing phosphorous or boron.

* * * * *